VIBRATORY FREQUENCY STANDARD FOR A TIMEKEEPING DEVICE

Original Filed July 10, 1964 2 Sheets-Sheet 1

INVENTORS
KLAUS SPARING
WILHELM TILSE
BY
Davis, Hoxie, Faithfull & Hapgood
ATTORNEYS Dec. 27, 1966 K. SPARING ETAL 3,293,845

VIBRATORY FREQUENCY STANDARD FOR A TIMEKEEPING DEVICE

Original Filed July 10, 1964 2 Sheets-Sheet 2

INVENTORS
KLAUS SPARING
WILHELM TILSE

BY

Davis, Hoxie, Faithfull & Hapgood
ATTORNEYS

United States Patent Office 3,293,845

Patented Dec. 27, 1966

3,293,845
VIBRATORY FREQUENCY STANDARD FOR A TIMEKEEPING DEVICE

Klaus Sparing, Pforzheim, and Wilhelm Tilse, Pforzheim-Birkenfeld, Germany, assignors to The United States Time Corporation, Waterbury, Conn., a corporation of Connecticut Original application July 10, 1964, Ser. No. 382,440, now Patent No. 3,201,932, dated Aug. 25, 1965. Divided and this application June 24, 1965, Ser. No. 476,775
Claims priority, application Germany, Mar. 16, 1963, U 9,647
The portion of the term of the patent subsequent to Aug. 24, 1982, has been disclaimed
2 Claims. (Cl. 58—23)

Figure 1:
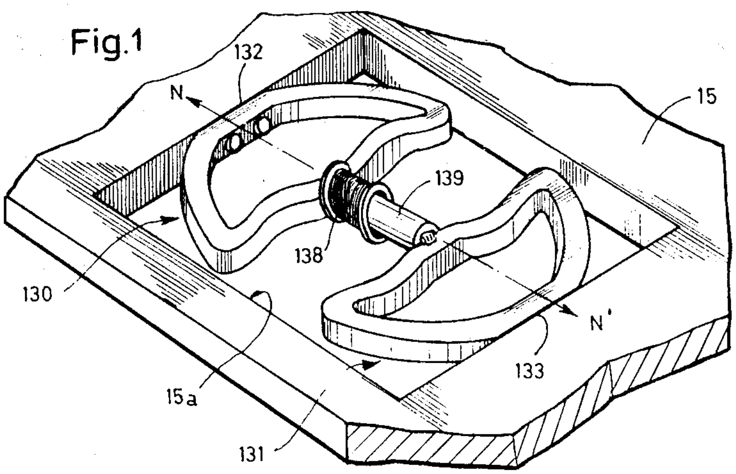

This application is a division of application Ser. No. 382,440, filed July 10, 1964, now Patent No. 3,201,932, issued Aug. 25, 1965. The application Ser. No. 382,440 was a continuation-in-part of application Ser. No. 325,027, filed Nov. 20, 1963, now abandoned.

The present invention relates to a timekeeping device having, as its time standard, a mechanical oscillator excitable to uniform oscillations.

In the known timekeeping devices of this type, the oscillator is coupled with the base, so that the oscillation frequency and accuracy is affected by the magnitude of this coupling. By the base is here meant not only the mounting support but the sum of all parts which are firmly connected with the mounting support and are not part of the oscillator. For example, a different damping of the base can affect the coupling and therefore affect the timekeeping accuracy.

In portable timekeeping devices, e.g. wrist watches, in which only energy sources of a relatively small capacity can be used, present devices have the considerable disadvantage that energy is carried to the coupled base. This means energy will be lost. Known devices of this type tried to overcome these disadvantages by having the base, in comparison to the oscillating system, relatively large and heavy. This made the timekeeping device relatively large and heavy, which is undesirable in portable watches. Even so, the loss of energy cannot basically be overcome by such preventive measures. Another disadvantage of this known timekeeping device is that the oscillator is shock sensitive. In response to outside shocks the oscillator changes its oscillation amplitude and frequency. One means to overcome the effect of shock is to use an oscillator, such as a tuning fork, having a high inherent oscillation frequency. In such a high-frequency device the coupling with the base is greater than with an oscillation arrangement of lower frequency, so that the diminution of the disadvantage of shock results in a greater loss of energy.

In accordance with the present invention, an oscillator is positioned on a base and is mechanically driven to uniform oscillation, the oscillation frequency serving as the timekeeping standard. The disadvantages of the prior art devices are avoided by means of an oscillation arrangement which has a multiple of oscillators which compensate for exterior effects. By this compensation practically no effective coupling exists between the base and oscillation system, so that the frequency stability cannot be affected by shock or other force components which act on the base, for instance different damping of the base. Exterior shocks and vibrations, which affect the base, do not affect the frequency stability of these systems, or at least affects them less.

The construction of the present invention can advantageously be made so that the oscillation arrangement has two oscillation systems which have at least one oscillator each, the oscillators being excitable to preferably friction-free oscillations of equal frequency by receiving essentially equal oscillation impulses. Both oscillation systems are arranged so that their exterior reaction sources are essentially opposingly directed. An oscillation arrangement which is oscillation compensated against exterior influences is the result of this construction. As a rule, it is desirable, for production reasons, that at least two oscillators of the oscillation arrangement have equal masses, i.e. equal moments of inertia, and that their directional energy also be equal, i.e. equal direction moments.

In order to obtain an optimum of oscillation compensation according to the invention, it is provided that the product $Aw$ ($A$=moment of inertia of the concerned oscillator, $w$=amplitude) for oscillators of different oscillation systems is approximately equal in magnitude.

In this type of construction, the oscillators may be curved bending oscillators. The bending oscillator is formed so that the line of its oscillation impulse is straight. The optimum of oscillation compensation is obtained when the impulse lines of the two bending oscillators coincide.

An example of this construction is a bending oscillator mounted with both its longitudinal end pieces fixed on an appropriate mounting so that it oscillates along its cross central plane. A closed ring-shaped construction of the bending oscillator has proven favorable in which the oscillation plane corresponds to the ring plane.

The impulse to the oscillation arrangement can be given in any appropriate manner. For example, one oscillator may be excitable by an impulse device and the other oscillator excited by being coupled with it. In this case the inherent oscillation frequency of the coupled oscillator is in phase opposition to the exteriorly impulsed oscillator.

In one preferred embodiment of the invention, at least two oscillators are oscillation excitable by separate exterior impulse devices. In this embodiment, both oscillators are impulsed independently from each other with the amplitude, frequency and phase necessary for the oscillation compensation. It can also be provided that at least two oscillators are oscillation excitable by a common inpulse device. A suitable device is an electromagnet with at least one exciter coil. The excitor coil cooperates with opposite coils or ferromagnetic bodies to deliver the impulse. Permanent magnets are preferred as the ferromagnetic bodies.

The impulse device can be self-controlling, as is known in the art, so that the exciter current induced in the exciter coil is synchronized with the inherent oscillation frequency of one of the oscillators. The impulse device can also be constructed in other ways, for example so that the impulse device receives its control or regulation commands from a separate source. Such a separate source may be an appropriate oscillation generator.

In order to improve the oscillation compensation, an amplitude adjustment device is provided for the adjustment of at least one of the oscillators. For example, a suitable amplitude adjustment device is a limiting means which restricts the amplitude to a preset maximum range or peak. Depending on the quality of the desired compensation, the width of this maximum range can be larger or smaller. It has been shown that, in general, it is sufficient when the maximum range is not greater than 10–15% of the average amplitude. The amplitude means may be a flexible banking device or a contact-free device such as coils or magnets.

A preferred amplitude adjustment device can be adjusted to control various amplitudes of the oscillator. In this arrangement the oscillation amplitude can be adjusted without changing the form of oscillation.

In order to synchronize the inherent frequencies of the two oscillators, at least one of the oscillators has an adjustment means for the adjustment of its inherent frequency. The same adjustment means can also be used for the adjustment of the time standard of the timekeeping device.

In the known timekeeping devices, the oscillation arrangement is relatively light compared with the base, in order to keep the coupling between the oscillation arrangement and the base within tolerable limits. By using the present invention, the moment of inertia of the oscillators can be chosen independently from the mass (moment of inertia) of the base.

The present invention permits one to choose the optimum oscillator without consideration of the mass of the base. In portable watches, e.g. wrist watches, a heavier oscillation arrangement having good frequency stability can be used by employing the present invention than in the previous constructions of this type. The mass (moment of inertia) of the base can be chosen so that it corresponds to stability specifications or any other constructive conditions. In case of a present total weight or a preset outer dimension of the timekeeping device, the frequency stability can still be high because the moment of inertia of a single oscillator is at least equal in magnitude, and preferably greater, than the moment of inertia of the base.

Figure 2:
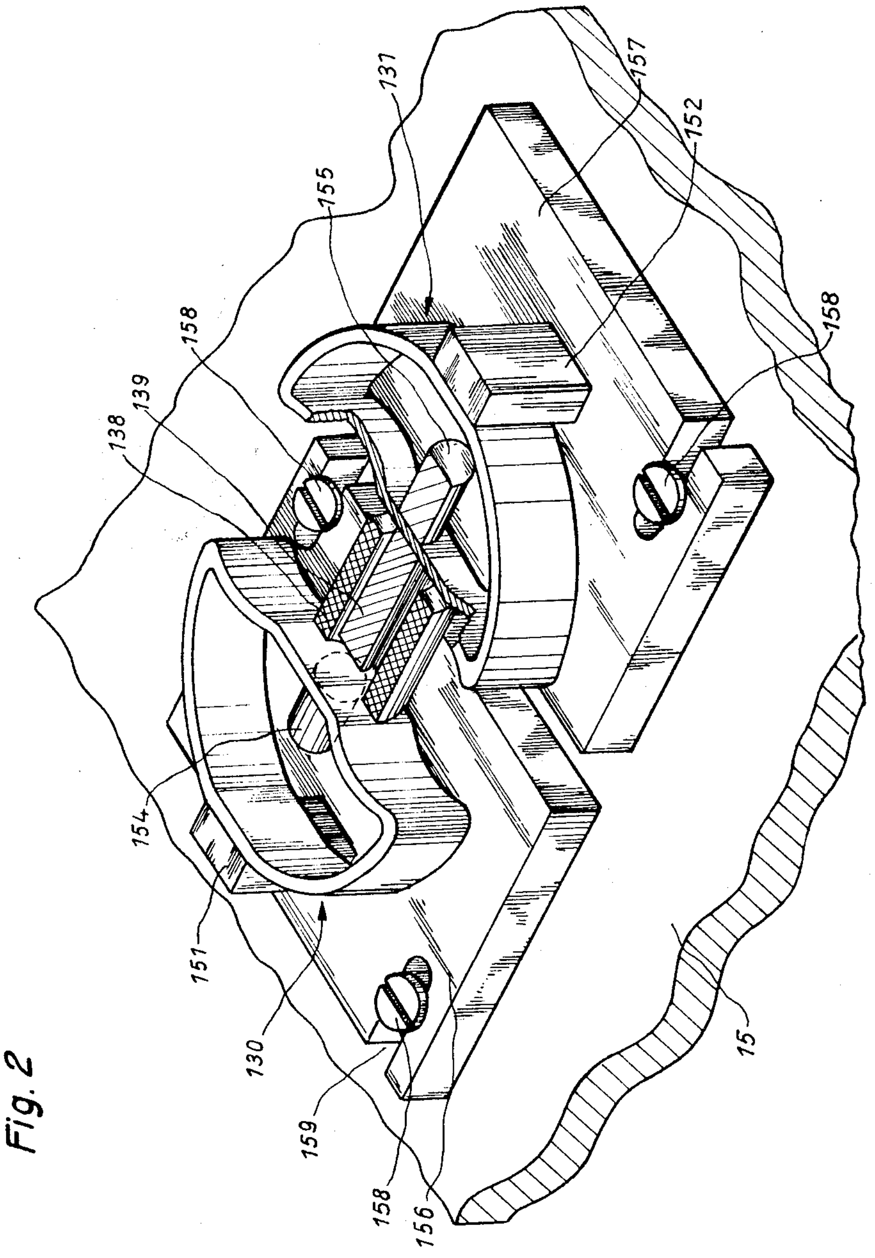

The drawings show various forms of execution of the invention. In the drawings:

FIG. 1 is a perspective drawing of oscillation arrangement according to the invention; and FIG. 2 is a perspective view of a form of construction similar to that of FIG. 1.

In order to simplify the drawings, the corresponding parts have the same reference numbers in all the figures.

In the form of construction of FIG. 1, two ring-shaped closed bending oscillators 130 and 131 are arranged in a rectangular opening 15*a* of the frame 15, and the bending oscillators 130 and 131 are rigidly fixed on the frame by portions 132 and 133 respectively. The bending oscillator 130 has on its front face a concentrically arranged exciter coil 138 and the other bending oscillator 131 has a permanent magnet 139 which cooperates with this coil and is similarly arranged. Both bending oscillators have a common oscillating plane and are symmetrically arranged so that their oscillation impulse action lines are located on their common center line N–N'.

The form of construction shown in FIG. 2 is similar to that of FIG. 1 in that it utilizes ring-shaped closed bending oscillators 130 and 131. These oscillators are attached to upright support members (pillars) 151 and 152, respectively. The support members are attached to plates 156 and 157, respectively, which in turn are attached by screws 158 to the base 15. The screws 158 protrude through slots in the plate members 156 and 157 so that the plate members may be positioned closer together or further apart. A permanent magnet 139 is attached to the flat portion of ring 131. An exciter coil 138 is attached to the flat portion of ring 130. Compensation weights 154 and 155 are attached on the inside of the flat portion of rings 130 and 131, respectively, and act to compensate for the weight of the coil 138 and magnet 139, respectively.

In all the described cases the conditions of the formula $A_1 w_1$ for the first oscillating arrangement $= A_2 w_2$ for the second oscillating arrangement, as mentioned above, is met.

The coil is self controllingly excited by a usual exciter current circuit in the rhythm of the inherent frequency of the vibrating system in such a manner that a vibration of a defined amplitude will be maintained, e.g., as a control and exciter current circuit a current circuit described in U.S. Patent 3,084,316 (Zemla) can be used.

We claim:

1. A timekeeping device including a base,
two mechanical oscillators attached to the base,
means to impulse the oscillators to oscillate uniformly and at the same frequency,
in which the oscillators compensate each other by having their products AW equal, where
A is the moment of inertia of the oscillator, and
W is its amplitude of oscillation,
and the reaction moments of the oscillators in-phase are in opposite directions,
characterized in that each of the oscillators are closed strips having two bending portions of spring material and said bending portions of one oscillator are proximate the said bending portions of the other oscillator.

2. The timekeeping device of claim 1 wherein the strips are mounted within a single opening of the base and have the same line of impulse and oscillation.

References Cited by the Examiner

UNITED STATES PATENTS 3,170,278 2/1965 Stutz ---------------- 58—23

RICHARD B. WILKINSON, *Primary Examiner.*

G. F. BAKER, *Assistant Examiner.*